(12) United States Patent
Liu et al.

(10) Patent No.: US 7,808,101 B2
(45) Date of Patent: Oct. 5, 2010

(54) 3D SMART POWER MODULE

(75) Inventors: Yong Liu, Scarborough, ME (US);
Yumin Liu, Jiangsu (CN); Hua Yang,
Jiang Sue Province (CN); **Tiburcio A.
Maldo, Jiangsu (CN); Margie T. Rios**,
Mandaue (PH)

(73) Assignee: Fairchild Semiconductor Corporation,
South Portland, ME (US)

( * ) Notice: Subject to any disclaimer, the term of this patent is extended or adjusted under 35 U.S.C. 154(b) by 76 days.

(21) Appl. No.: 12/028,051

(22) Filed: Feb. 8, 2008

(65) Prior Publication Data

US 2009/0200657 A1 Aug. 13, 2009

(51) Int. Cl.
*H01L 23/48* (2006.01)
*H01L 23/34* (2006.01)

(52) U.S. Cl. .................. 257/723; 257/697; 257/728; 257/778; 257/E23.169

(58) Field of Classification Search .................. 257/723, 257/728, 697, E23.169
See application file for complete search history.

(56) References Cited

U.S. PATENT DOCUMENTS

| | | | | | |
|---|---|---|---|---|---|
| 4,322,778 | A | * | 3/1982 | Barbour et al. | 361/794 |
| 5,075,821 | A | * | 12/1991 | McDonnal | 361/721 |
| 5,774,353 | A | * | 6/1998 | Wieloch | 363/146 |
| 6,933,593 | B2 | * | 8/2005 | Fissore et al. | 257/675 |
| 7,091,586 | B2 | * | 8/2006 | Millik et al. | 257/685 |
| 7,514,774 | B2 | * | 4/2009 | Leung et al. | 257/686 |
| 2005/0093120 | A1 | * | 5/2005 | Millik et al. | 257/678 |
| 2007/0063340 | A1 | * | 3/2007 | Owyang et al. | 257/723 |

* cited by examiner

*Primary Examiner*—Nitin Parekh
(74) *Attorney, Agent, or Firm*—Thomas R. FitzGerald, Esq.; Hiscock & Barclay, LLP

(57) ABSTRACT

A 3D smart power module for power control, such as a three phase power control module, includes a two sided printed circuit (PC) board with power semiconductor devices attached to one side and control semiconductor devices attached to the other side. The power semiconductor devices are die bonded to a direct bonded copper substrate which has a bottom surface exposed in the molded package. In one embodiment the module has 27 external connectors attached to one side of the PC board and arranged in the form of a ball grid array.

17 Claims, 14 Drawing Sheets

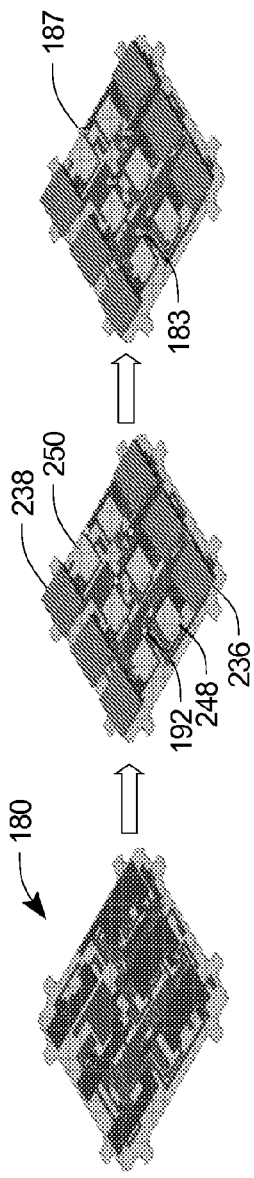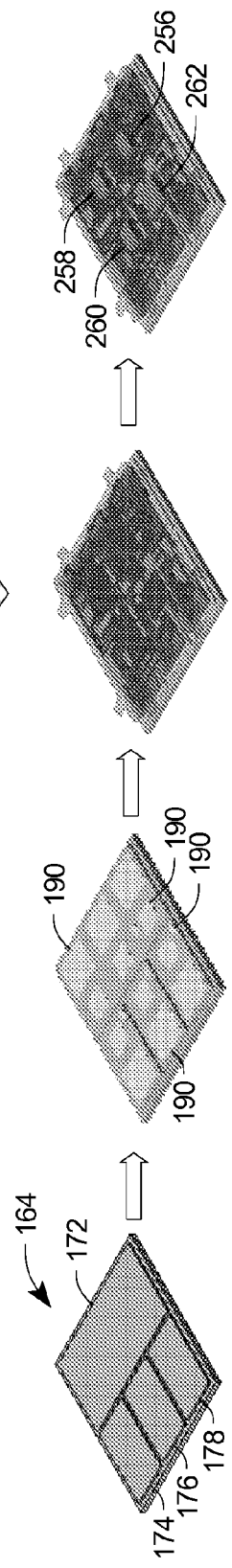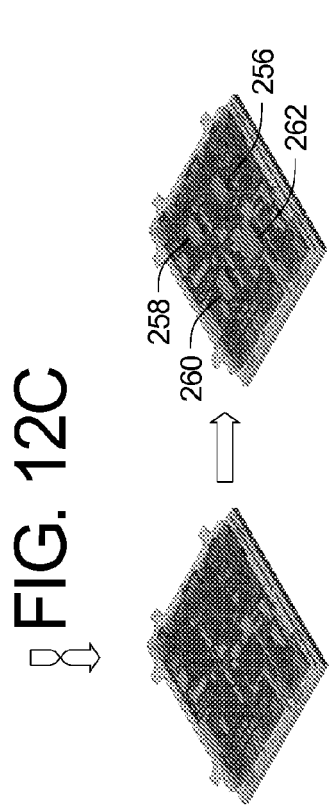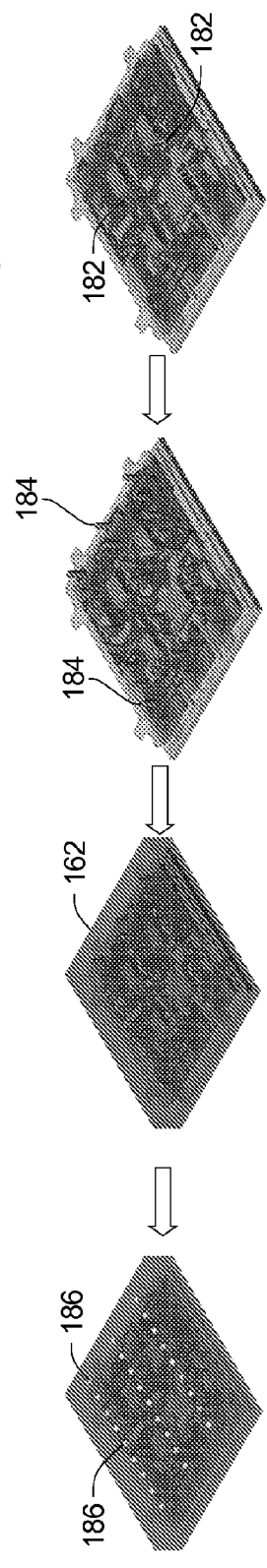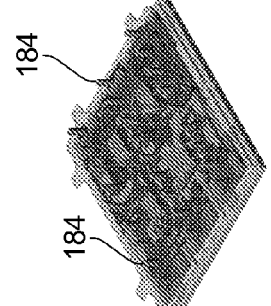

3D SMART POWER MODULE

FIELD OF THE INVENTION

This invention relates to power semiconductor packages with multiple semiconductor dice.

BACKGROUND OF THE INVENTION

Generally smart power modules (SPM) include power devices such as IGBTs and IC control devices which are mounted on metallic leadframes. However such modules are subject to leadframe deformation and warpage due to large package size. Also the large number of bond wires increases the likelihood of a wire bond failure and also increases the likelihood of cracked die during the wire bonding operation.

As with all power devices, the dissipation of heat is a major factor in packaging such devices, particularly if there are multiple power devices in the same package which are susceptible to failure when heated above certain temperatures.

SUMMARY OF THE INVENTION

The invention comprises, in one form thereof, an encapsulated semiconductor package having a first plurality of conductive regions having die bond surfaces that lie in a single plane, a second plurality of semiconductor devices die bonded to the first plurality of die bond surfaces, a printed circuit (PC) board having a third plurality of traces on a first side thereof and a fourth plurality of traces on a second side thereof opposite to the first side, the second plurality of semiconductor devices attached to selected ones of the third plurality of traces, a third plurality of vias in the PC board connecting each of the third plurality of traces to selected ones of the fourth plurality of traces, a fifth plurality of semiconductor devices attached to selected ones of the fourth plurality of traces, and a sixth plurality of external pins attached to some of the fourth plurality of traces.

In another form, the invention includes a method of forming an encapsulated semiconductor package The method comprises the steps of die bonding a first plurality of semiconductor devices to surfaces of a second plurality of conductive regions, the surfaces lying in a single plane, attaching the first plurality of semiconductor devices to selected ones of a third plurality of traces on a first side of a printed circuit (PC) board, the PC board having vias between the third plurality of traces and a fourth plurality of traces on a second side of the PC board opposite to the first side, attaching a fifth plurality of semiconductor devices to selected ones of the fourth plurality of traces, and attaching a sixth plurality of external pins to selected ones of the fourth plurality of traces.

BRIEF DESCRIPTION OF THE DRAWINGS

The aforementioned and other features, characteristics, advantages, and the invention in general will be better understood from the following more detailed description taken in conjunction with the accompanying drawings, in which:

FIGS. 12A, 12B, 12C, 12D, 12E, 12F, 12H, 12I, 12J, and 12K are perspective views showing the processing stages which may occur in assembling the package shown in FIG. 2;

Figure 1:
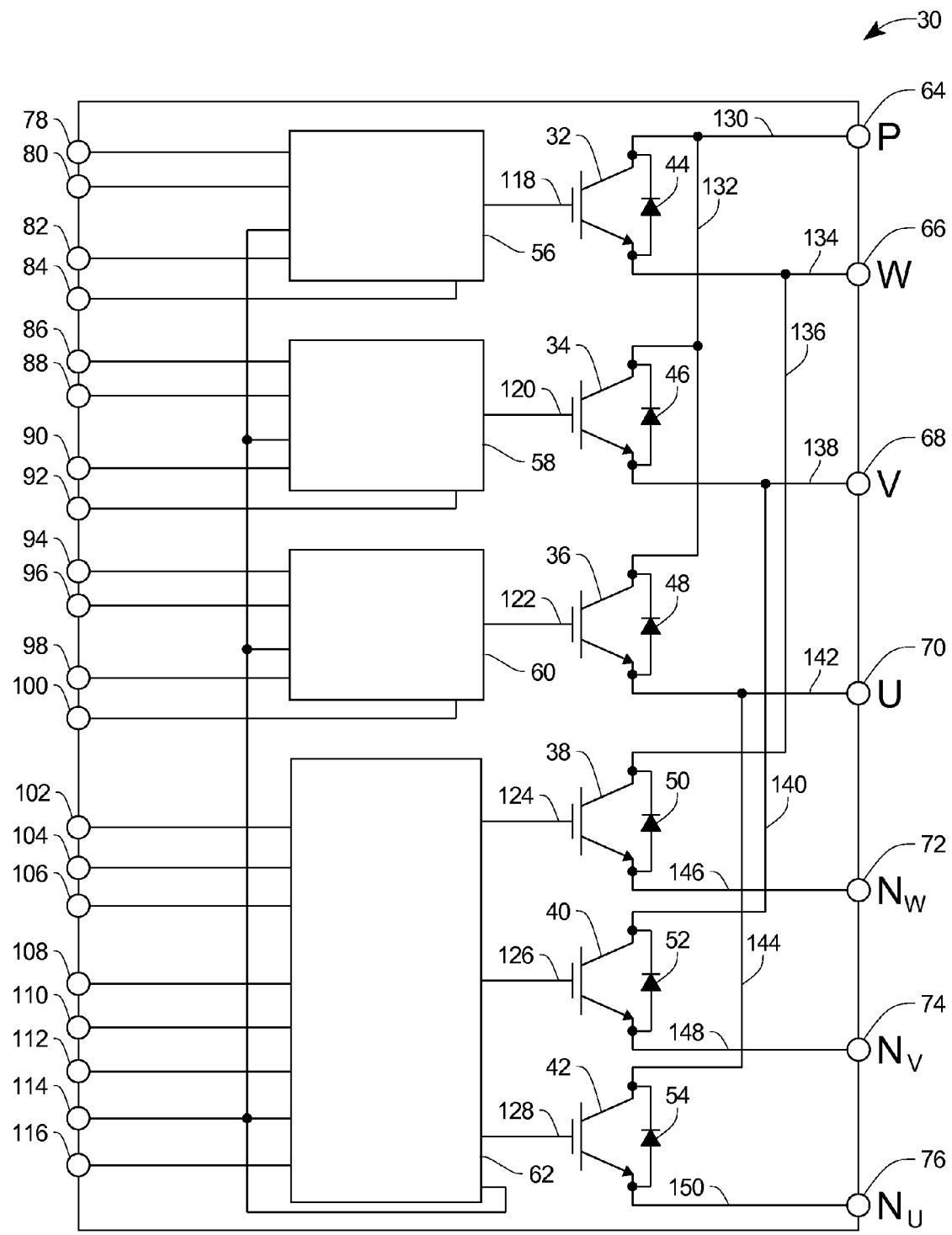
FIG. 1 is a schematic diagram of a three phase smart power module.
Figure 2:
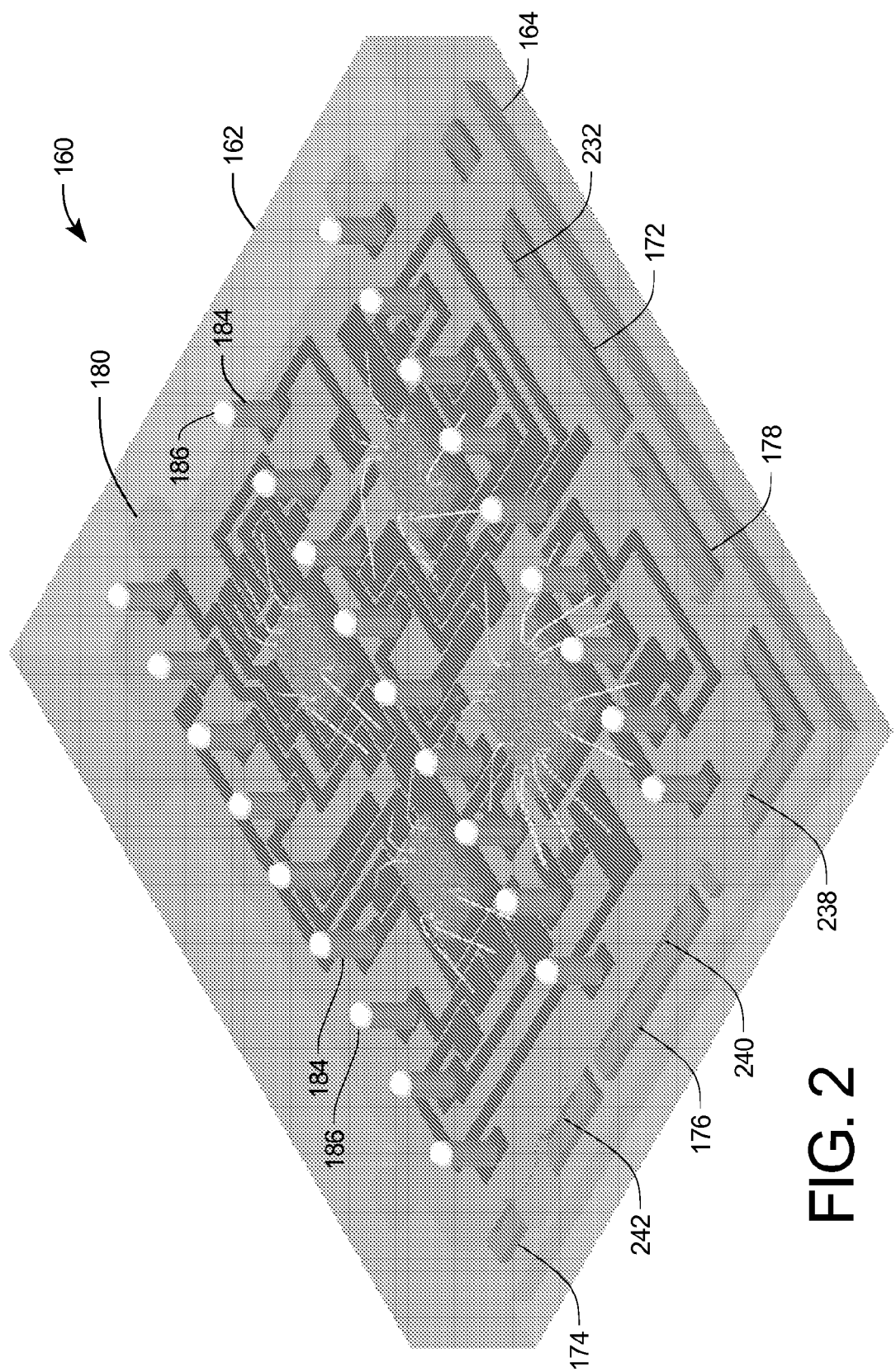
FIG. 2 is a perspective view of a package for the physical components for containing and interconnecting the components in the circuit diagram shown in FIG. 1.
Figure 3:
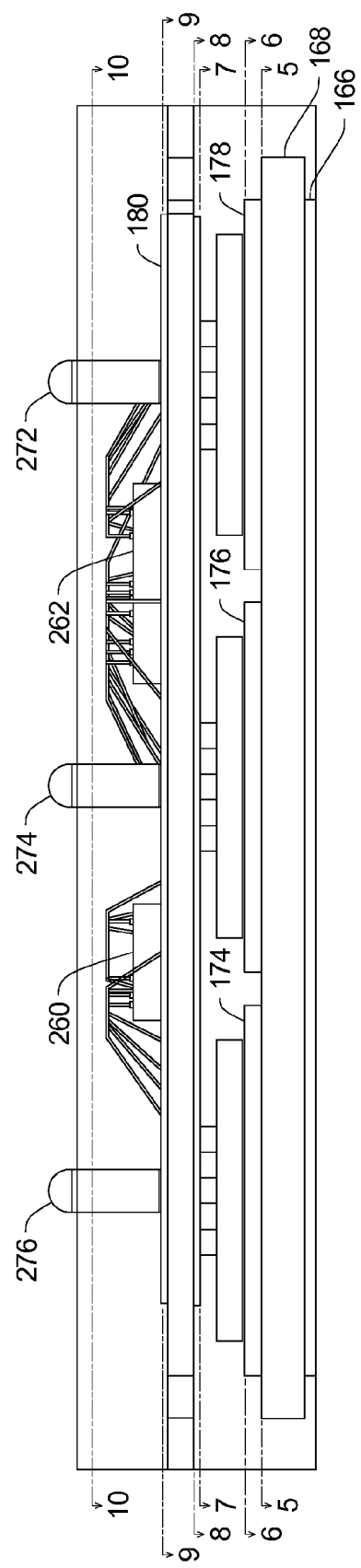
FIG. 3 is an end view of the package shown in FIG. 2 with the encapsulation shown in outline.
Figure 4:
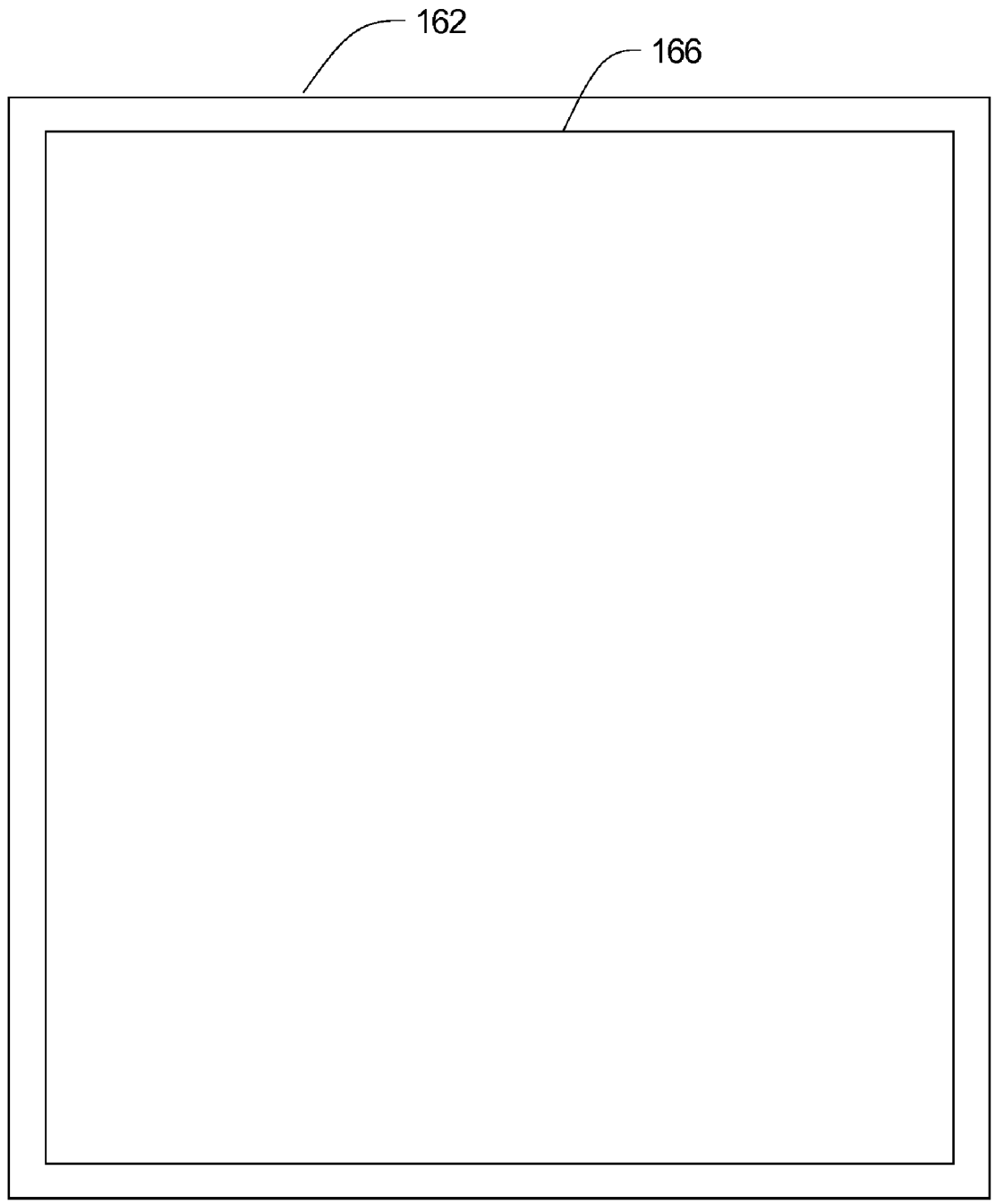
FIG. 4 is a bottom view of the package shown in FIG. 2.
Figure 5:
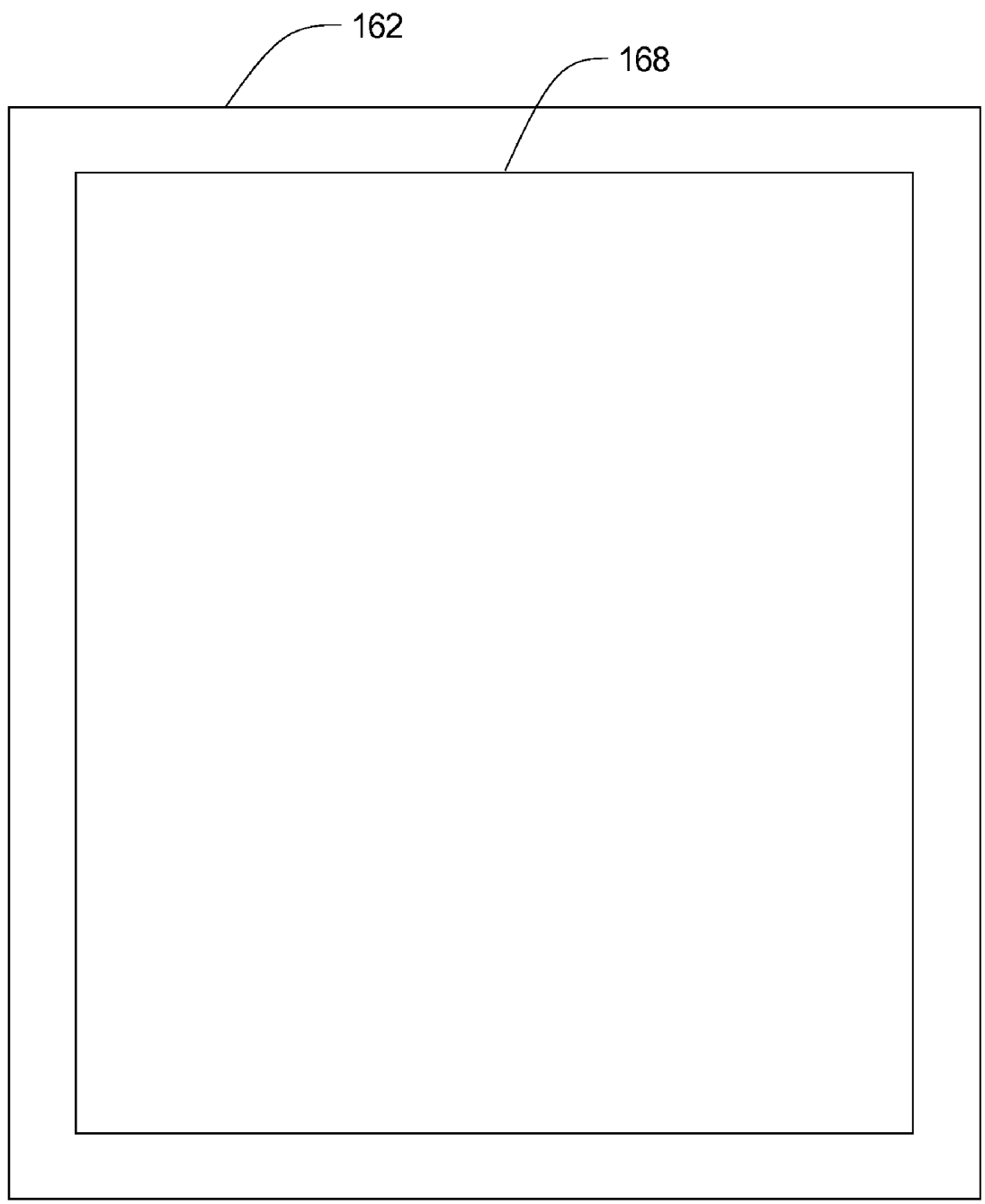
FIG. 5 is a top cross sectional view taken along line 5-5 shown in FIG. 3.
Figure 6:
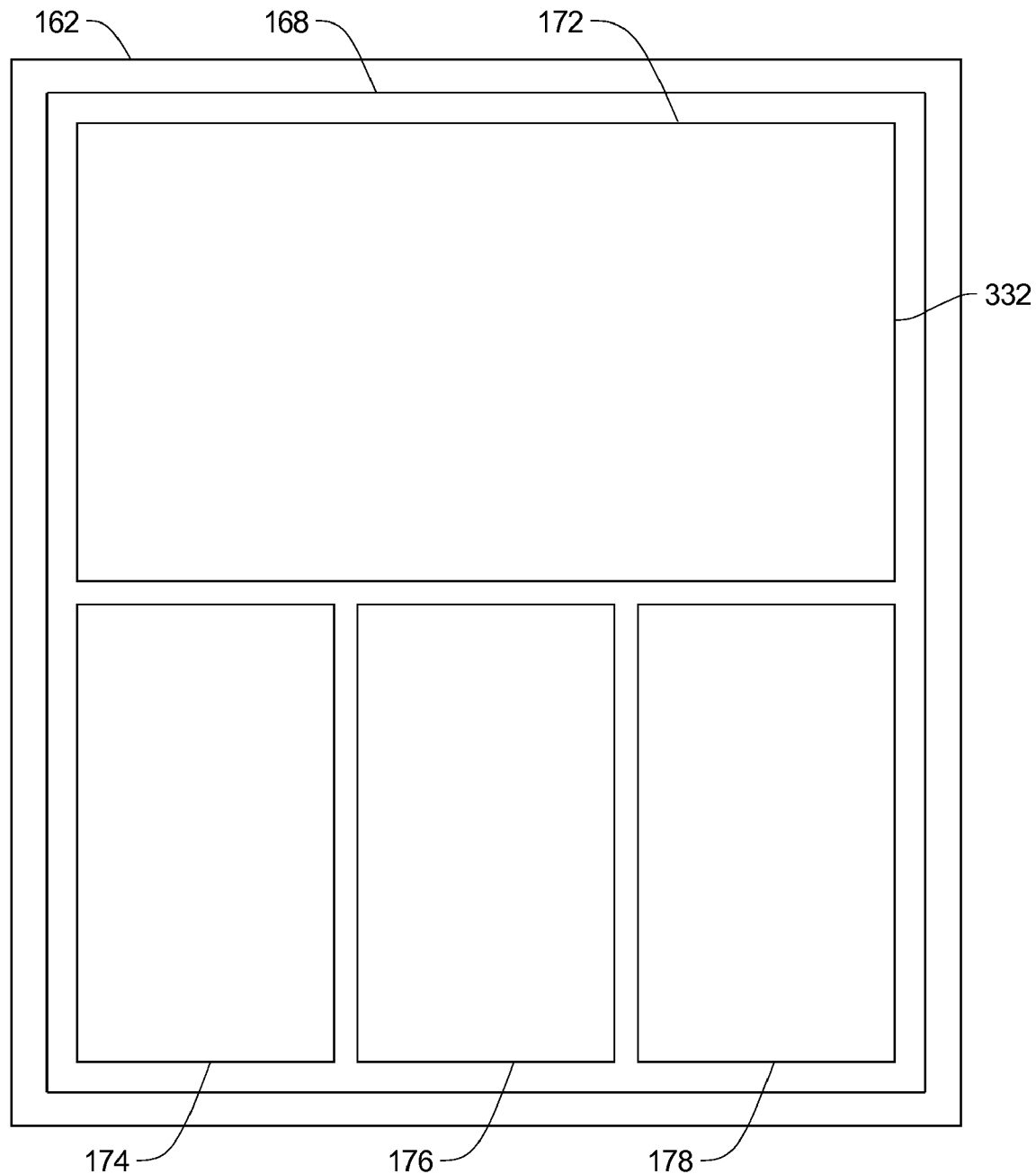
FIG. 6 is a top cross sectional view taken along line 6-6 shown in FIG. 3.
Figure 7:
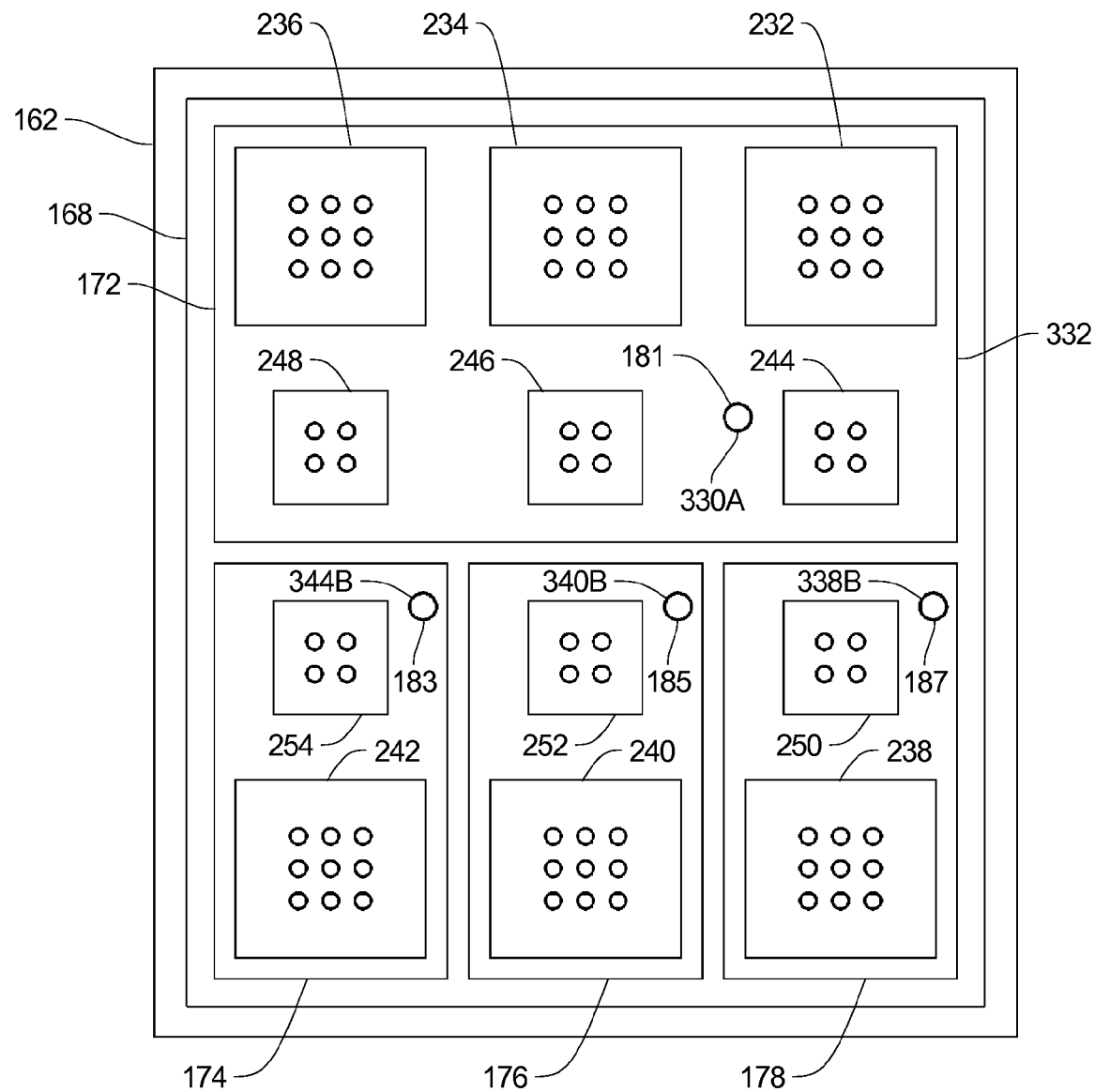
FIG. 7 is a top cross sectional view taken along line 7-7 shown in FIG. 3.
Figure 8:
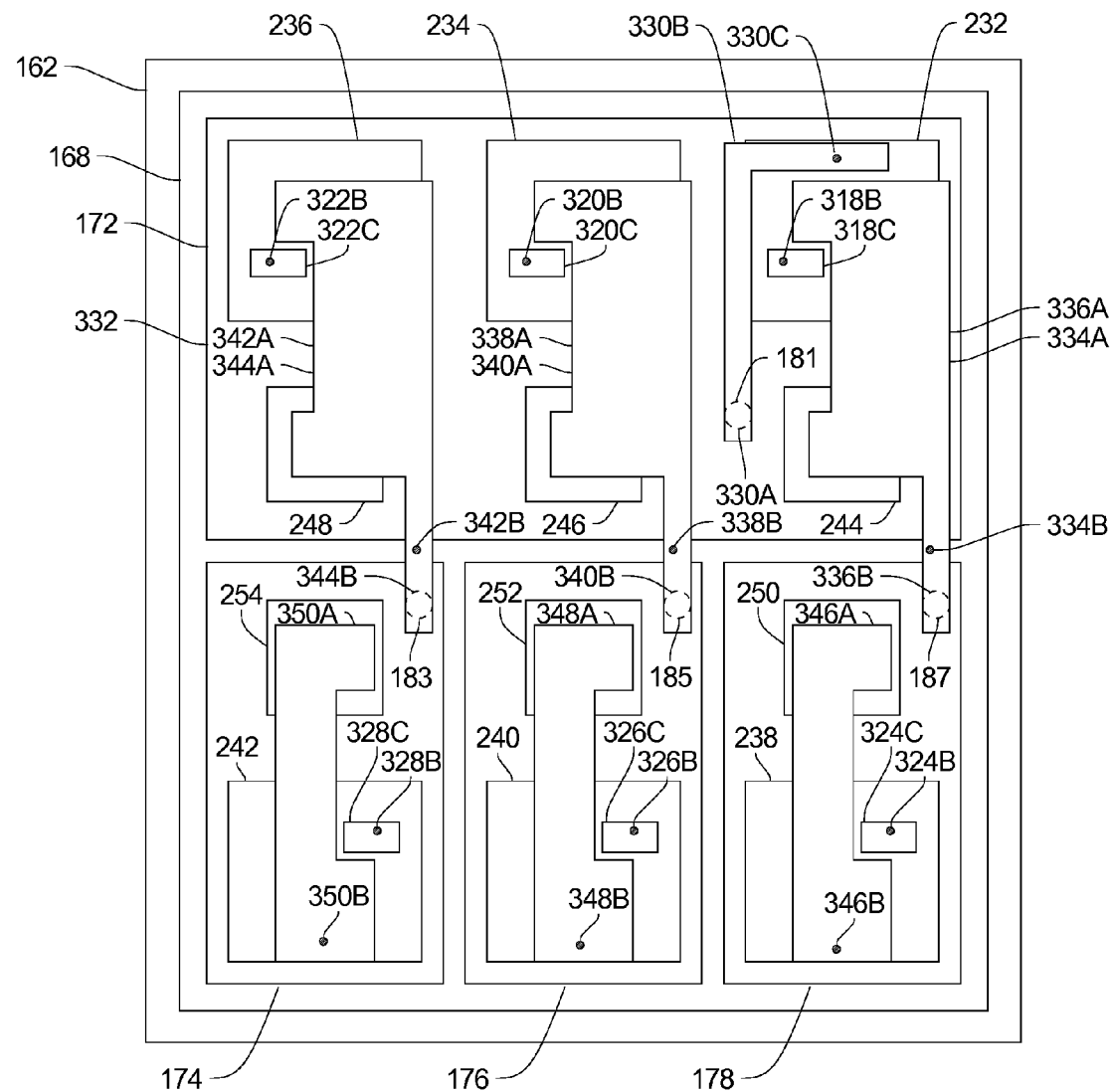
FIG. 8 is a top cross sectional view taken along line 8-8 shown in FIG. 3.
Figure 9:
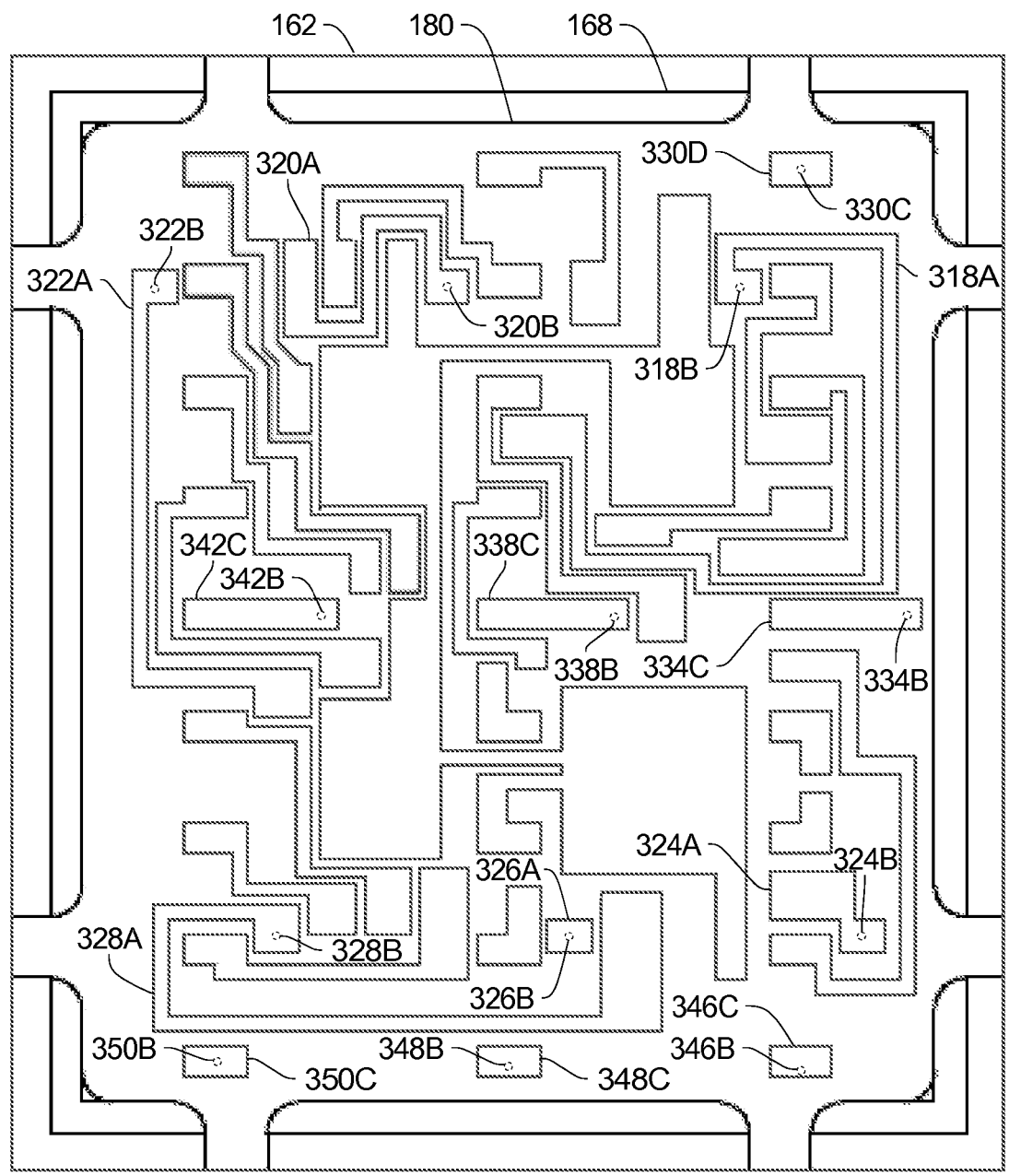
FIG. 9 is a top cross sectional view taken along line 9-9 shown in FIG. 3.
Figure 10:
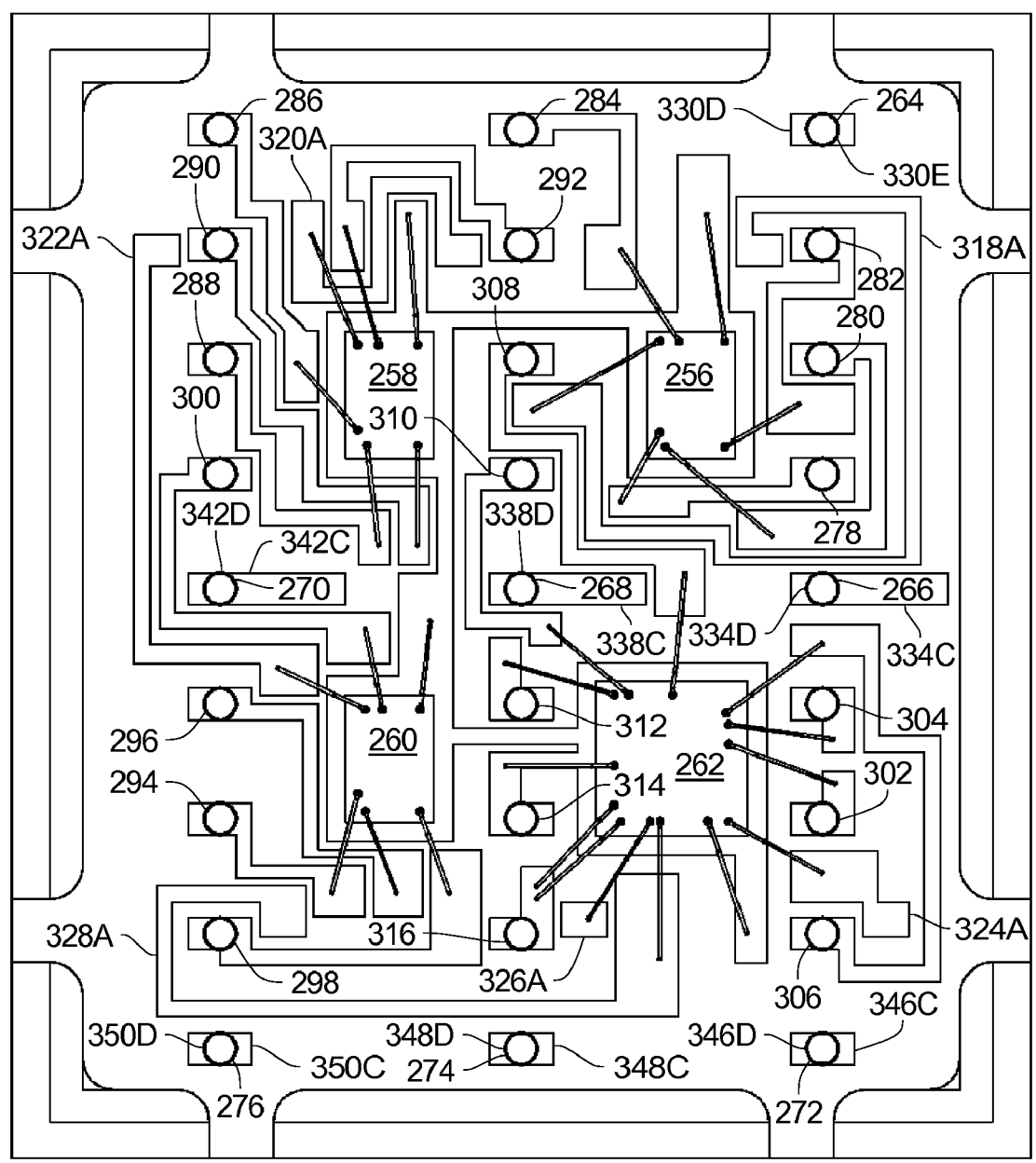
FIG. 10 is a top cross sectional view taken along line 10-10 shown in FIG. 3.
Figure 11:
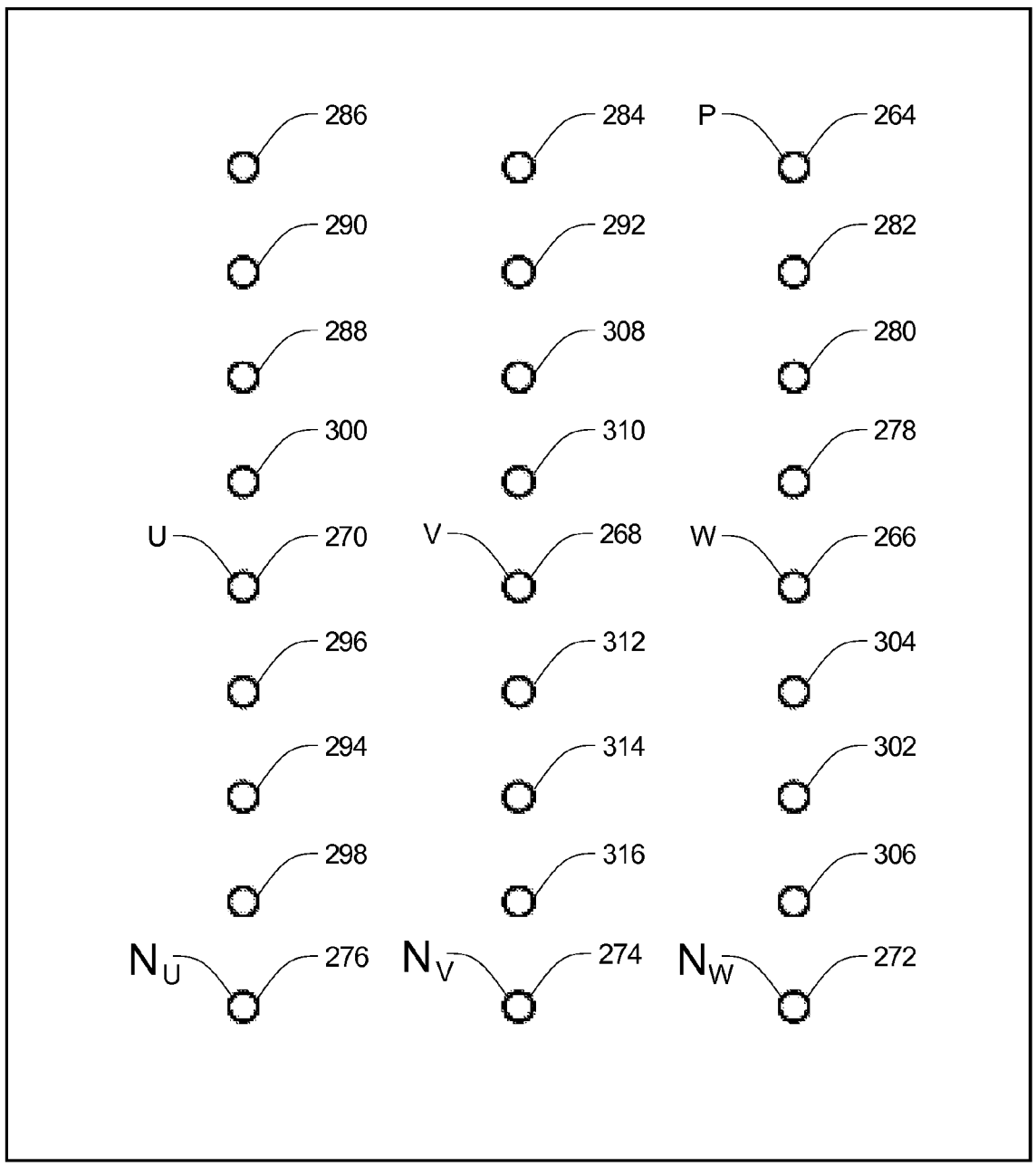
FIG. 11 is a top view of the package shown in FIG. 2.
Figure 13:
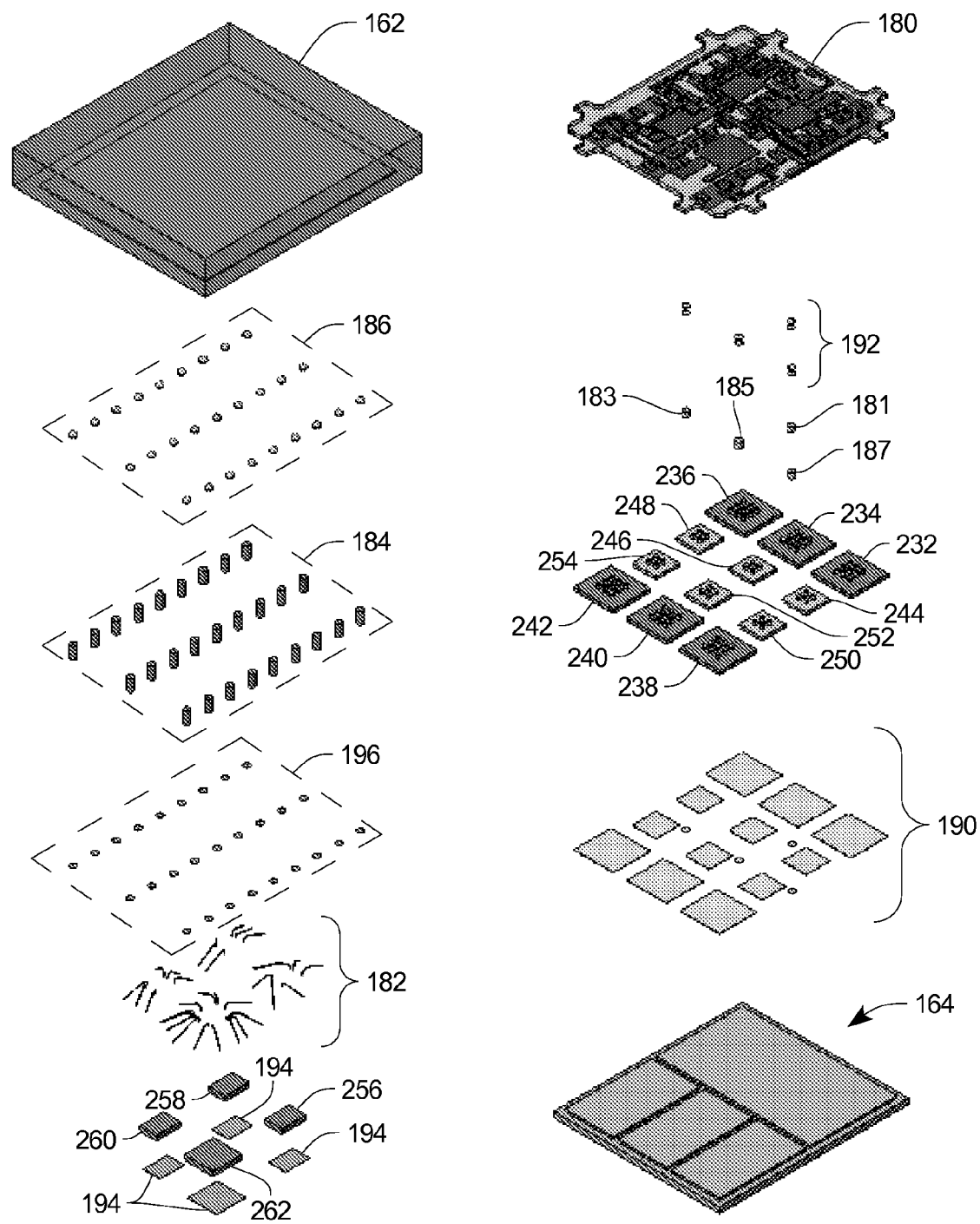
FIG. 13 is an exploded diagram of the package shown in FIG. 2.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Turning now to the drawings, FIG. 1 is schematic diagram of a three-phase motor control circuit 30 having six N channel IGBT transistors 32, 34, 36, 38, 40, and 42. Each of the IGBT transistors has a fast recover diode (FRD) 44, 46, 48, 50 52, and 54, respectively, the anodes of which are connected to the collectors, and the cathodes are connected to the emitters of their respective transistors. Transistors 32, 34, and 36 are driven by identical high voltage ICs 56, 58, and 60. Transistors 38, 40, and 42 are all driven by a single low voltage IC 62.

The control circuit 30 has, on the right side of FIG. 1, a positive DC link input 64 which is connected to the collectors of the transistors 32, 34, and 36. The emitter of transistor 32 is connected to a W phase output 66 and to the collector of transistor 38. Similarly, the emitter of transistor 34 is connected to a V phase output 68 and to the collector of transistor 40, and the emitter of transistor 36 is connected to a U phase output 70 and to the collector of transistor 42. The emitter of transistor 38 is connected to a negative DC link input 72 for the W phase, the emitter of transistor 40 is connected to a negative DC link input 74 for the V phase, and the emitter of transistor 42 is connected to a negative DC link input 76 for the U phase.

The ICs 56, 58, 60, and 62 receive power and control signals, and provide status output on the connections 78-116.

Reference numbers for the interconnections of selected devices and terminals are also shown in FIG. 1:

Connection 130 from terminal P, 64, to the collectors of IGBTs 32, 34, and 36;

Connection 132 connecting the collectors of IGBTs 32, 34, and 36 together;

Connection 134 from terminal W, 66, to the emitter of IGBT 32;

Connection 136 from the emitter of IGBT 32 to the collector of IGBT 38;

Connection 138 from terminal V, 68, to the emitter of IGBT 34;

Connection 140 from the emitter of IGBT 34 to the collector of IGBT 40;

Connection 142 from terminal U, 70, to the emitter of IGBT 36;

Connection 144 from the emitter of IGBT 36 to the collector of IGBT 42;

Connection 146 from terminal $N_W$, 72, to the emitter of IGBT 38;

Connection 148 from terminal $N_V$, 74, to the emitter of IGBT 40;

Connection 150 from terminal $N_U$, 76, to the emitter of IGBT 42;

The following table shows the corresponding semiconductor devices, external terminals and electrical interconnections in an embodiment of a 3D smart power module (SPM) 200 of the present invention shown in FIGS. 2-13.

| FIG. 1 Reference Nos. | Description | Corresponding Reference Nos. in FIGS. 2-10 |
|---|---|---|
| 32 | IGBT | 232 |
| 34 | IGBT | 234 |
| 36 | IGBT | 236 |
| 38 | IGBT | 238 |
| 40 | IGBT | 240 |
| 42 | IGBT | 242 |
| 44 | FRD | 244 |
| 46 | FRD | 246 |
| 48 | FRD | 248 |
| 50 | FRD | 250 |
| 52 | FRD | 252 |
| 54 | FRD | 254 |
| 56 | High Voltage IC | 256 |
| 58 | High Voltage IC | 258 |
| 60 | High Voltage IC | 260 |
| 62 | Low Voltage IC | 262 |
| 64 | P terminal (Positive DC-Link Input) | 264 |
| 66 | W terminal (Output for W phase) | 266 |
| 68 | V terminal (Output for V phase) | 268 |
| 70 | U terminal (Output for U phase) | 270 |
| 72 | $N_W$ terminal (Negative DC-Link Input for W phase) | 272 |
| 74 | $N_V$ terminal (Negative DC-Link Input for V phase) | 274 |
| 76 | $N_U$ terminal (Negative DC-Link Input for U phase) | 276 |
| 78 | High Side W Phase Bias Voltage for IGBT | 278 |
| 80 | High Side W Phase Bias Voltage for IC 56 | 280 |
| 82 | Input Signal for High Side W Phase | 282 |
| 84 | High Side W Phase Bias Voltage Ground for IGBT | 284 |
| 86 | High Side V Phase Bias Voltage for IGBT | 286 |
| 88 | High Side V Phase Bias Voltage for IC 56 | 288 |
| 90 | Input Signal for High Side V Phase | 290 |
| 92 | High Side V Phase Bias Voltage Ground for IGBT | 292 |
| 94 | High Side U Phase Bias Voltage for IGBT | 294 |
| 96 | High Side U Phase Bias Voltage for IC 56 | 296 |
| 98 | Input Signal for High Side U Phase | 298 |
| 100 | High Side U Phase Bias Voltage Ground for IGBT | 300 |
| 102 | Input Signal for Short Circuit Protection | 302 |
| 104 | Input to Set the Duration for Fault-Output Detection Timing | 304 |
| 106 | Fault Output | 306 |
| 108 | Input Signal for the W phase Negative DC-Link | 308 |
| 110 | Input Signal for the V phase Negative DC-Link | 310 |
| 112 | Input Signal for the U phase Negative DC-Link | 312 |

-continued

| FIG. 1 Reference Nos. | Description | Corresponding Reference Nos. in FIGS. 2-10 |
|---|---|---|
| 114 | Ground for the Low Voltage IC | 314 |
| 116 | Bias Voltage for the Low Voltage IC and IGBTs Driven by the Low Voltage IC | 316 |
| 118 | Gate Connection for IGBT 32 | 318A, 318B, 318C |
| 120 | Gate Connection for IGBT 34 | 320A, 320B, 320C |
| 122 | Gate Connection for IGBT 36 | 322A, 322B, 322C |
| 124 | Gate Connection for IGBT 38 | 324A, 324B, 324C |
| 126 | Gate Connection for IGBT 40 | 326A, 326B, 326C |
| 128 | Gate Connection for IGBT 42 | 328A, 328B, 328C |
| 130 | Connection from terminal P, 64, to the collectors of IGBTs 32, 34, and 36 | 330A, 330B, 330C, 330D, 330E |
| 132 | Common connection of the collectors of IGBTs 32, 34, and 36 | 332 |
| 134 | Connection from terminal W, 66, to the emitter of IGBT 32 | 334A, 334B, 334C, 334D |
| 136 | Connection from the emitter of IGBT 32 to the collector of IGBT 38 | 336A, 336B |
| 138 | Connection from terminal V, 68, to the emitter of IGBT 34 | 338A, 338B, 338C, 338D |
| 140 | Connection from the emitter of IGBT 34 to the collector of IGBT 40 | 340A, 340B |
| 142 | Connection from terminal U, 70, to the emitter of IGBT 36 | 342A, 342B, 342C, 342D |
| 144 | Connection from the emitter of IGBT 36 to the collector of IGBT 42 | 344A, 344B, 344C, 344D |
| 146 | Connection from terminal $N_W$, 70, to the emitter of IGBT 38 | 346A, 346B, 346C, 346D |
| 148 | Connection from terminal $N_V$, 72, to the emitter of IGBT 40 | 348A, 348B, 348C, 348D |
| 150 | Connection from terminal $N_U$, 76, to the emitter of IGBT 42 | 350A, 350B, 350C, 350D |

Turning now to FIGS. 2-13, various views of a 3D smart power module (SPM) 160 according to a first embodiment of the present invention are shown. In the drawings an encapsulating material 162 is shown in outline. The SPM 160 has multiple layers including a direct bonded copper (DBC) plate 164 having a bottom metallic layer 166, the bottom surface of which is not encapsulated, a ceramic layer 168, and a top metallic layer 170 which has been patterned and etched to form four separate die bond pads 172, 174, 176, and 178 for six IGBTs 232, 234, 236, 238, 240, and 242 and with six FRDs 244, 246, 248, 250, 252, and 254. The IGBTs 232, 234, and 236 and the FRDs 244, 246, and 248 are bonded to the die bond pad 172, the IGBT 238 and the FRD 250 are bonded to the die bond pad 178, the IGBT 240 and the FRD 252 are bonded to the die bond pad 176, and the IGBT 242 and the FRD 254 are bonded to the die bond pad 174. Connecting pins 181, 183, 185, and 187 are connected to the die bond pads 172, 174, 176, and 178, respectively.

The SPM 160 includes a double sided printed circuit board (PCB) 180 in one embodiment with a 13 conductive regions or traces on the bottom, with 35 top traces, and 13 vias connecting the 13 bottom traces with 13 selected top traces. Attached to the top traces of the PC board are three high voltage ICs 256, 258, and 260, a low voltage IC 262, a plurality of wire bonds 182, 27 ball grid array (BGA) pins 184, and 27 BGA solder balls 186. (In an alternative embodiment shown in FIG. 10 the BGA pins 184 are replaced with BGA blocks 188.)

Figure 14:
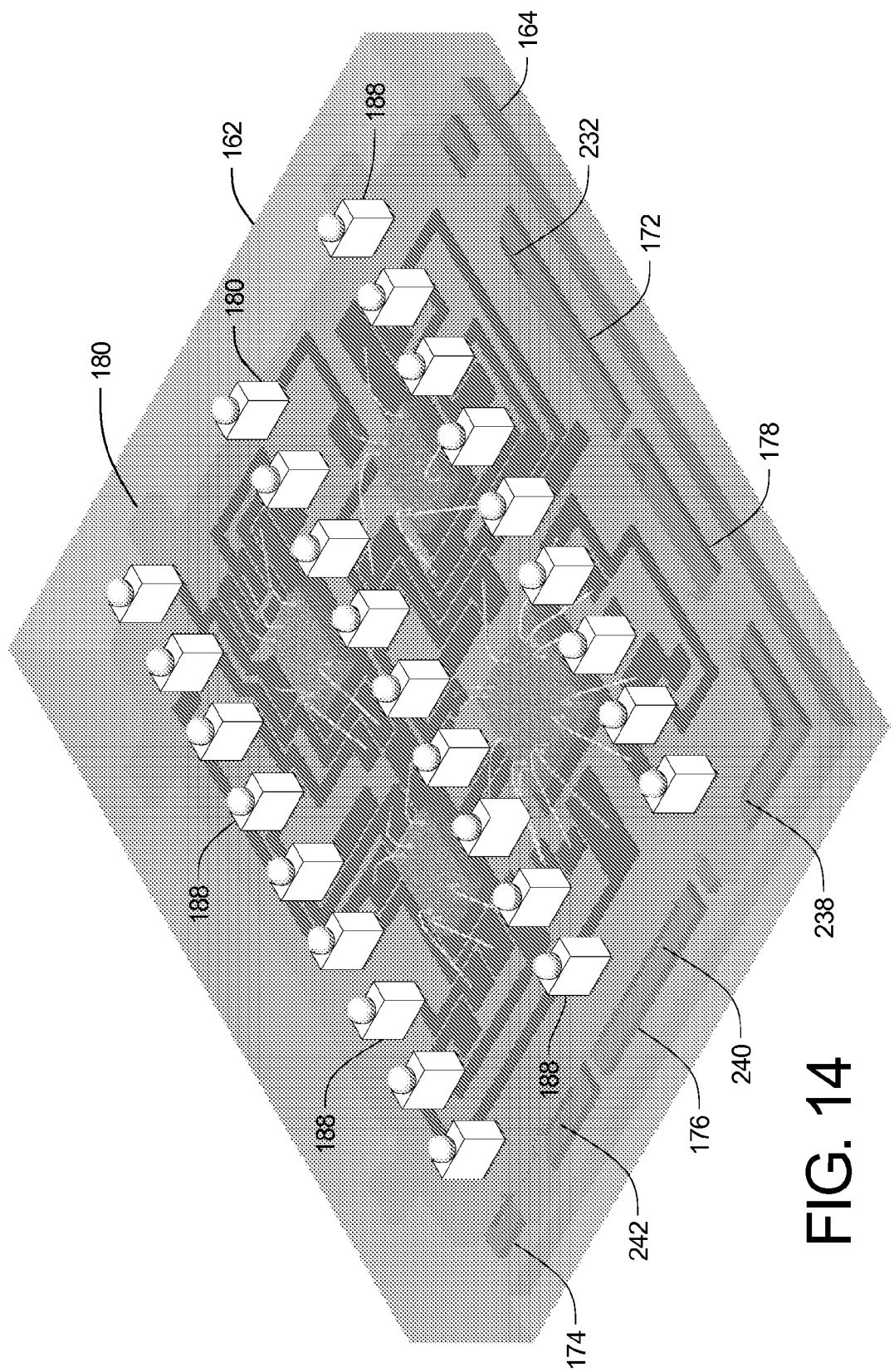
FIG. 14 is an alternative embodiment of the package shown in FIG. 2.

A first solder paste pattern 190 is used to die bond the six IGBTs 232-242, the six FRDs 244-254, and the four connecting pins 181, 183, 185, and 187 to the top layer 170 of the DBC 164. A second solder paste pattern 192 is used to attach the four connecting pins 181, 183, 185, and 187 to four of the bottom traces of the PC board 180. The IGBTs 232-242 and the FRDs 244-254 have solder bump contacts which are attached to the bottom traces of the PC board 180. The three high voltage ICs 256-260 and the low voltage IC 262 are die bonded to traces on the top of the PC board 180 with an epoxy pattern of die bonding material 194, and the 27 BGA pins 184 and the 27 BGA blocks 188 (Shown in FIG. 14) are attached to top traces of the PC board 180 with soft solder pattern 196.

FIGS. 12A-12K, which are all perspective views, show the steps which may be taken to make the SPM 30. FIG. 12A is a bottom perspective view of the PC board 180. The IGBTs 232-242 and FRDs 244-254 are flip-chip bonded to the bottom of the PC board 180 as shown in FIG. 12B. Also, in this step the solder paste pattern 192 is screened onto the PC board 180. The four connecting pins 181-187 are soldered with the solder paste 192 to the PC board 180 in FIG. 12C.

The DBC plate 164 with the patterned die bond area 172-178, as shown in FIG. 12D, the die bond paste 190 is screen printed onto the DBC 164 as shown in FIG. 12E. In the next step the two subassemblies are connected together by die bonding the IGBTs 232-242 and the FRDs 244-254 to the DBC 164 along with the connecting pins 181-187 as shown in FIG. 12F which is a top perspective view of the joined subassemblies. In FIG.12G, the three high power ICs 256-260 and the low power IC 262 are die bonded to the top of the PC board 180 using epoxy paste 194. FIG. 12H shows the wire bonds 182 attached between the ICs 256-262 and traces on the top of the PC board 180. The connecting pins 184 are soldered to the top of the PC board 180 using a screened soft solder pattern 196 applied to the PC board 180 as shown in FIG. 12I. FIG. 12J shows the assembly after a molding operation, after which the BGAs 186 are attached to the tops of the interconnecting pins 184 to complete the assembly of the SPM 30.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. An encapsulated semiconductor package comprising:
  a substrate with regions having die bond surfaces that lie in a single plane;
  first semiconductor devices respective die bond surfaces to the die bond surfaces;
  a printed circuit (PC) board having first and second opposite sides and traces on both sides thereof, the first semiconductor devices electrically attached to the traces on the first side;
  vias in the PC board connecting a plurality of the traces on the first side of the PC board to selected traces on the second side of the PC board;
  second semiconductor devices attached to the selected traces of the second side of the PC board; and
  external pins attached to some of the traces on the second side of the PC board.

2. The semiconductor package set forth in claim 1 wherein the regions having die bond surfaces are part of a heat sink having an exposed surface that is not encapsulated.

3. The semiconductor package set forth in claim 2 wherein the heat sink electrically insulates the regions having die bond surfaces from the exposed surface.

4. The semiconductor package set forth in claim 1 wherein the first semiconductor devices are attached to the traces on the first side of the PC board using solder bumps.

5. The semiconductor package set forth in claim 1 wherein the second semiconductor devices are attached to the traces on the second side of the PC board using epoxy die bonding material.

6. The semiconductor package set forth in claim 1 wherein the external pins are orthogonal to the second side of the PC board.

7. The semiconductor package set forth in claim 1 further including electrical connectors between the regions having die bond surfaces and selected ones of the traces on the first side of the PC board.

8. The semiconductor package set forth in claim 1 further including electrical connectors between die surfaces of the second semiconductor devices and selected ones of the traces on the second side of the PC board.

9. The semiconductor package set forth in claim 1 further including solder balls on ends of the external pins.

10. The semiconductor package set forth in claim 1 wherein the external pins are arranged in rows and columns.

11. The semiconductor package set forth in claim 1 wherein the external pins form a ball grid array.

12. The semiconductor package set forth in claim 1 wherein the first semiconductor devices are power devices.

13. The semiconductor package set forth in claim 1 wherein the second semiconductor devices are control devices.

14. The semiconductor package set forth in claim 1 wherein at least some of the first semiconductor devices have control terminals.

15. The semiconductor package set forth in claim 14 wherein the control terminals are driven by the second semiconductor devices.

16. The semiconductor package set forth in claim 1 wherein the first semiconductor devices are flip chip attached to the traces on the first side of the PC board.

17. The semiconductor package as set forth in claim 1 wherein the second semiconductor devices are wire bonded to the selected traces of the second side of the PC board.

* * * * *